(12) United States Patent
Nakamura et al.

(10) Patent No.: US 9,461,264 B2
(45) Date of Patent: Oct. 4, 2016

(54) ORGANIC EL DEVICE AND METHOD OF MANUFACTURING ORGANIC EL DEVICE

(75) Inventors: Masahiro Nakamura, Eindhoven (NL); Masahito Yamana, Hyogo (JP); Takeyuki Yamaki, Nara (JP); Daiki Kato, Osaka (JP); Takahiro Koyanagi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/985,297

(22) PCT Filed: Dec. 16, 2011

(86) PCT No.: PCT/JP2011/079203
§ 371 (c)(1),
(2), (4) Date: Aug. 14, 2013

(87) PCT Pub. No.: WO2012/114619
PCT Pub. Date: Aug. 30, 2012

(65) Prior Publication Data
US 2013/0320324 A1    Dec. 5, 2013

(30) Foreign Application Priority Data

Feb. 21, 2011    (JP) .................... 2011-035172

(51) Int. Cl.
*H01L 29/08* (2006.01)
*H01L 35/24* (2006.01)
(Continued)

(52) U.S. Cl.
CPC ....... *H01L 51/5203* (2013.01); *H01L 51/0024* (2013.01); *H01L 51/5209* (2013.01); *H05B 33/26* (2013.01)

(58) Field of Classification Search
CPC ..................................................... H01L 51/52
USPC ....................................................... 257/40
See application file for complete search history.

(56) References Cited

U.S. PATENT DOCUMENTS 5,844,175 A * 12/1998 Nakanishi ............... G06F 3/045
178/18.01
8,563,112 B2 * 10/2013 Suzuki ................ H01L 51/5237
428/76

(Continued)

FOREIGN PATENT DOCUMENTS

JP        03-238792        10/1991
JP        2003-308968      10/2003

(Continued)

OTHER PUBLICATIONS

International Search report in PCT/JP2011/079203, mail date is Feb. 7, 2012.

*Primary Examiner* — Mohsen Ahmadi
*Assistant Examiner* — Ismail Muse
(74) *Attorney, Agent, or Firm* — Greenblum & Bernstein, P.L.C.

(57) ABSTRACT

An organic EL device includes: a first substrate having electrical conductivity; an organic layer formed on the first substrate; a second substrate having translucency; and an electrode layer formed on the second substrate. The electrode layer on the first substrate and the organic layer on the second substrate contact each other. The organic layer is not formed in the peripheral portion of the second substrate. In the region where the organic layer is not formed, a portion of the electrode layer is provided to extend, and the first substrate is not present to face the extended electrode layer, and the portion of the electrode layer is exposed to form an electrode portion. Thus, the electrode portion can be formed by a simple procedure in which, for example, the first substrate is removed, and the organic EL device can be efficiently manufactured.

14 Claims, 4 Drawing Sheets

(51) Int. Cl.
*H01L 51/00* (2006.01)
*H01L 51/52* (2006.01)
*H05B 33/26* (2006.01)

(56) References Cited

U.S. PATENT DOCUMENTS

| | | | |
|---|---|---|---|
| 2003/0193287 A1 | 10/2003 | Sakamoto et al. | |
| 2004/0104672 A1* | 6/2004 | Shiang | H01L 51/5262 313/506 |
| 2006/0087230 A1* | 4/2006 | Ghosh | H01L 23/26 313/512 |
| 2007/0259586 A1 | 11/2007 | Sakamoto et al. | |
| 2010/0087307 A1* | 4/2010 | Murata | C03C 3/085 501/67 |
| 2010/0327275 A1 | 12/2010 | Saito et al. | |
| 2011/0052857 A1* | 3/2011 | Suzuki | H05B 33/04 428/76 |
| 2011/0096256 A1* | 4/2011 | Nagata | G02F 1/134309 349/33 |
| 2013/0105783 A1 | 5/2013 | Saito et al. | |
| 2013/0119368 A1 | 5/2013 | Nakamura et al. | |
| 2013/0126853 A1 | 5/2013 | Nakamura et al. | |

FOREIGN PATENT DOCUMENTS

| | | |
|---|---|---|
| JP | 2007-324062 | 12/2007 |
| JP | 2010-165620 | 7/2010 |
| WO | 2009/107201 | 9/2009 |

* cited by examiner

<(A) LINE OR (D) LINE CROSS-SECTION>

(a)

<(B) LINE CROSS-SECTION>

(b)

<(C) LINE CROSS-SECTION>

(c)

(a)

(b)

(c)

(d)

(e)

ORGANIC EL DEVICE AND METHOD OF MANUFACTURING ORGANIC EL DEVICE

TECHNICAL FIELD

The present invention relates to an organic EL device in which an electrode taking-out portion is formed.

BACKGROUND ART

In an electroluminescence (EL) device, a light emitting layer is formed on a transparent substrate so as to be interposed between an anode and a cathode. When a voltage is applied between the electrodes, light is emitted by exciters generated by recombination of holes and electrons injected as carriers to the light emitting layer. EL devices are generally classified into organic EL devices in which an organic substance is used as a fluorescent substance of a light emitting layer, and inorganic EL devices in which an inorganic substance is used as a fluorescent substance of a light emitting layer. In particular, organic EL devices are capable of emitting light of high luminance with a low voltage, and various colors of emitted light are obtained therefrom depending on the types of fluorescent substances. In addition, it is easy to manufacture organic EL devices as planar light emitting panels, and thus organic EL devices are used as various display devices and backlights. Furthermore, in recent years, organic EL devices designed for high luminance have been realized, and attention has been paid to use of these organic EL devices for lighting apparatuses.

A general organic EL device has a configuration in which a transparent electrode such as ITO is formed as an anode on a glass substrate, an organic layer including a light emitting layer composed of an organic light emitting material or the like is formed on the anode, and a metallic thin film layer such as aluminum is formed as a cathode on the organic layer. The anode is present between the substrate and the organic layer, and thus, in order to connect the anode to an external power supply terminal, a portion of the anode or a portion of an auxiliary electrode which assists in the electrical conductivity of the anode is provided so as to extend to the outside of a region where the organic layer is formed, and the extended portion serves as an electrode taking-out portion. In addition, the anode, the organic layer, and the cathode excluding the electrode taking-out portion of the anode and a portion of the cathode are sealed by a sealing member such as copper foil. According to this configuration, light generated by the light emitting layer when a voltage is applied between the anode and the cathode passes through the anode and the glass substrate directly or after being reflected by the cathode, and then is taken out from the device.

Unlike a general LED (inorganic EL device) in which a light emitting layer is crystallized, an organic layer of an organic EL device which includes a light emitting layer is composed of an organic material such as a polymer and thus can have flexibility. In addition, among such organic materials, there are some materials from which a light emitting layer can be formed by spin coating, ink jet printing, screen printing, or the like in addition to vacuum deposition. Furthermore, the substrate is not limited to the above-described glass substrate, and a translucent plastic substrate having flexibility can also be used as the substrate. When these materials are used, the organic EL device can be used as a light source of a flexible light-emitting device which can be wound or folded. In addition, there is known a method for manufacturing an organic EL device by a so-called roll-to-roll process in which a flexible substrate which is wound in a roll shape is fed to a film-forming apparatus for forming a light emitting layer and the like, and a device is wound in a roll shape and collected after film formation (e.g., see Japanese Laid-Open Patent Publication No. 2010-165620).

DISCLOSURE OF THE INVENTION

However, the above patent document 1 described above does not specifically describe how to form an electrode taking-out portion. In general, in order to provide an electrode taking-out portion, an anode and a light emitting layer need to be formed by patterning in complicated shapes, and thus a device cannot be necessarily efficiently manufactured even by the above-described manufacturing method by the roll-to-roll process.

The present invention has been made in view of the above problem, and an object of the present invention is to provide an organic EL device which allows an electrode taking-out portion to easily be formed therein and can be efficiently manufactured.

In order to solve the above problem, an organic EL device according to the present invention includes: a first substrate having electrical conductivity; an organic layer formed on the first substrate; a second substrate having translucency; and an electrode layer formed on the second substrate. A surface of the first substrate on which the organic layer is formed and a surface of the second substrate on which the electrode layer is formed are located so as to face each other. In any region of a peripheral portion of the second substrate, the organic layer is not formed. On the second substrate, a portion of the electrode layer is provided in a portion facing the region where the organic layer is not formed, so as to extend to an outer peripheral side of a region where the organic layer is present. The first substrate is not present in a portion facing the extended electrode layer, and the extended electrode layer is exposed from the first substrate, thereby constituting an electrode taking-out portion.

In the above organic EL device, the first substrate and the second substrate are preferably joined to each other by an adhesive layer provided on a peripheral portion of the first substrate or the second substrate.

In the above organic EL device, a moisture absorbent layer is preferably provided on a surface of the second substrate which surface faces the electrode layer, such that the moisture absorbent layer does not overlap the region where the organic layer is formed and is not in contact with the electrode layer.

In the above organic EL device, the electrode taking-out portion excluding a portion of the electrode layer is preferably sealed by a sealing member.

In the above organic EL device, a portion of the sealing member is preferably an extended portion of the adhesive layer.

In the above organic EL device, the sealing member is preferably a member separate from the adhesive layer.

In the above organic EL device, the electrode layer preferably includes a main electrode portion which is in contact with the organic layer, and an auxiliary electrode portion which is in contact with the main electrode portion and is insulated from the organic layer.

In the above organic EL device, the electrode layer in the electrode taking-out portion is preferably a portion of the auxiliary electrode portion.

In the above organic EL device, the main electrode portion is preferably composed of a grid electrode in which low-resistance thin wires are arranged in a lattice manner, in a stripe manner, or in a honeycomb manner.

In the above organic EL device, the first substrate is preferably composed of a metal material having barrier properties.

According to the present invention, the electrode layer provided so as to extend in the region where the organic layer is not formed is exposed from the first substrate, thereby forming the electrode taking-out portion. Thus, the electrode taking-out portion can be formed by a simple procedure in which, for example, the first substrate is removed, and the organic EL device can be efficiently manufactured.

DESCRIPTION OF THE PREFERRED EMBODIMENTS

Figure 1:
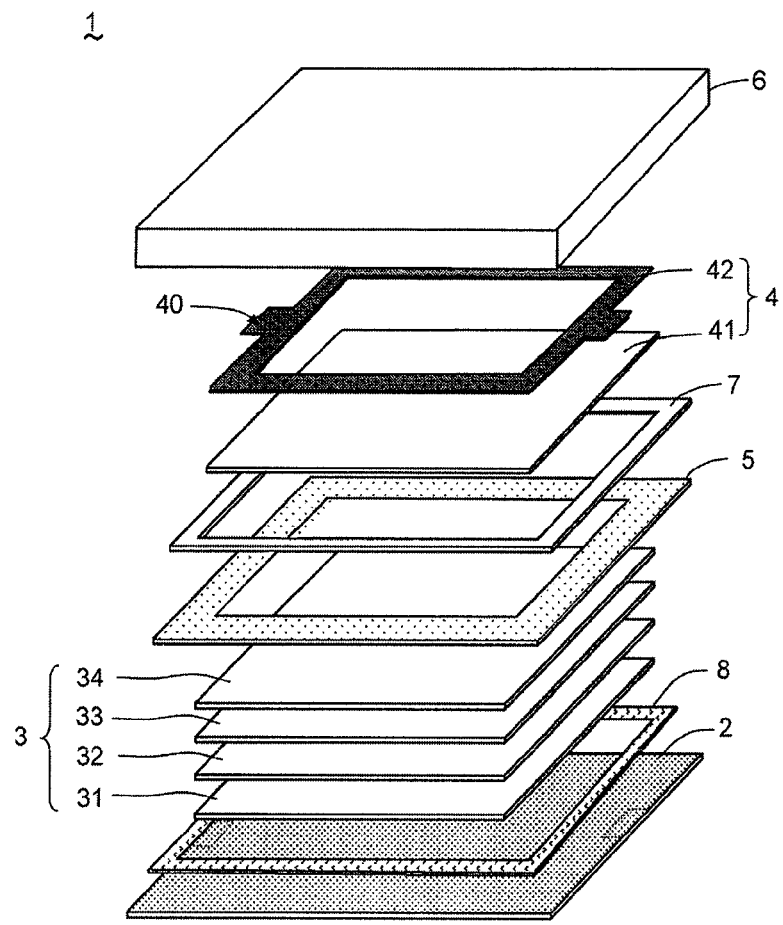
FIG. 1 is an exploded perspective view of an organic EL device according to an embodiment of the present invention.

The configuration of an organic EL device according to an embodiment of the present invention will be described with reference to FIGS. 1 to 5. As shown in FIG. 1, the organic EL device 1 according to the present embodiment includes a first substrate 2 having electrical conductivity, an organic layer 3 formed on the first substrate 2, a second substrate 6 having translucency, and an electrode layer 4 formed on the second substrate 6. A surface of the first substrate 2 on which the organic layer 3 is formed and a surface of the second substrate 6 on which the electrode layer 4 is formed are located so as to be in contact with each other. In the present embodiment, the first substrate 2 serves not only as a substrate for forming the organic layer 3 but also as a cathode for supplying electrons. In addition, the electrode layer 4 serves an anode for supplying positive holes to the organic layer 3.

The organic layer 3 includes an electron injection layer 31, a light emitting layer 32, a hole transport layer 33, and a hole injection layer 34 in order from the first substrate 2 side. The electrode layer 4 includes a main electrode portion 41 which is in contact with the organic layer 3 and an auxiliary electrode portion 42 which is in contact with the main electrode portion 41 and is insulated from the organic layer 3 by an insulating layer 7. An adhesive layer 5 includes a moisture absorbent layer 8, and the moisture absorbent layer 8 is interposed between the first substrate 2 and the second substrate 6 so as to be located at the outer periphery of the insulating layer 7.

In any region of a peripheral portion of the second substrate 6, the organic layer 3 is not formed. In the present embodiment, the organic layer 3 is not formed in portions indicated by a (B) line and a (C) line in FIG. 2. The region where the organic layer 3 is not formed suffices to be provided at any of the four sides of the second substrate 6, may not be provided over the overall length of one side, and may be provided partially at one side (not shown). Meanwhile, in portions indicated by an (A) line and a (D) line in FIG. 2, the organic layer 3 is formed to the end portions (also see FIG. 3(a)). It is noted that in a process of manufacturing the organic EL device 1 according to the present embodiment, in the case where the organic layer 3 is formed on the first substrate 2 by a roll-to-roll process, a roll moving direction is set as an (A) line or (D) line direction in FIG. 2. At both sides including the portions indicated by the (A) line and the (D) line in FIG. 2, a retaining member (not shown) is provided for sealing the organic layer 3 and the like and protecting the side portion of the organic EL device 1. The retaining member may be provided also at both sides including the portions indicated by the (B) line and the (C) line in FIG. 2.

Figure 2:
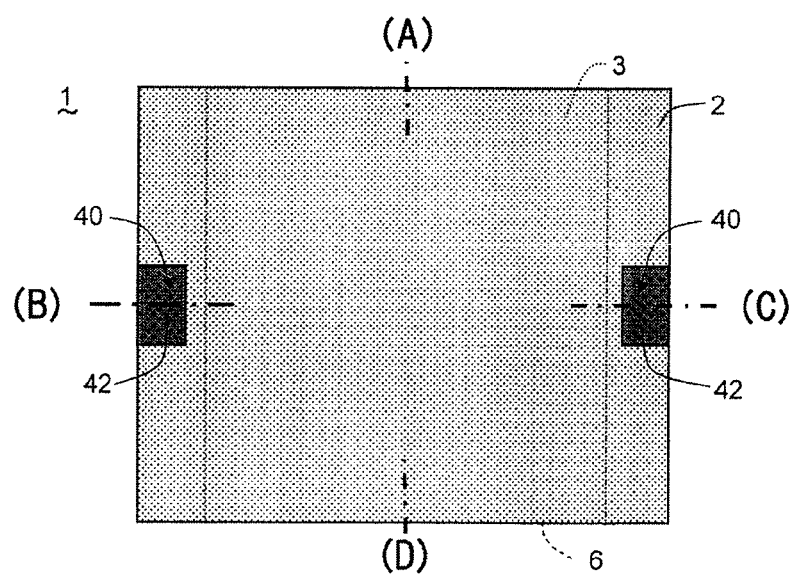
FIG. 2 is a back view of the organic EL device.
Figure 3:
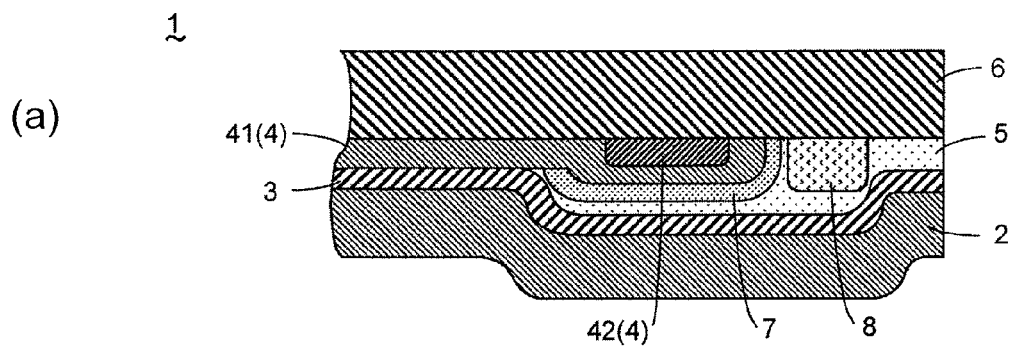
FIG. 3(a) is a side cross-sectional view taken along an (A) line or a (D) line in FIG. 2.
FIG. 3(b) is a side cross-sectional view taken along a (B) line in FIG. 2.
FIG. 3(c) is a side cross-sectional view taken along a (C) line in FIG. 2.
Figure 3:
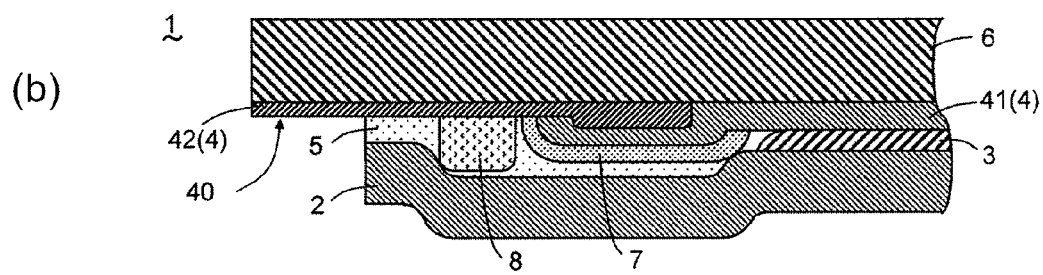
Figure 3:
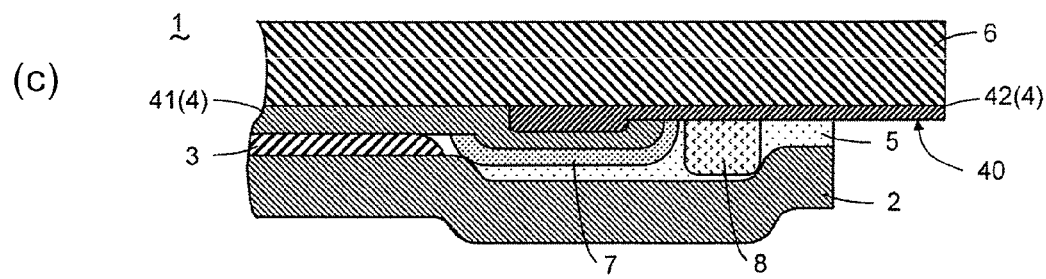
Figure 4:
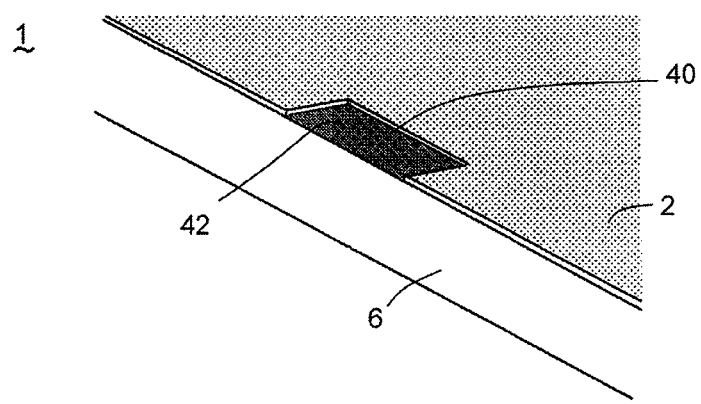
FIG. 4 is a perspective view of an electrode taking-out portion of the organic EL device.

In the region where the organic layer 3 is not formed, namely, in each of portions indicated by the (B) line and the (C) line in FIG. 2 in the present embodiment, a portion of the auxiliary electrode portion 42 is provided via the insulating layer 7 so as to extend (see FIG. 1). The extended auxiliary electrode portion 42 is exposed by removing the first substrate 2 that faces the extended auxiliary electrode portion 42 as shown in FIGS. 3(b) and 3(c) and FIG. 4, thereby constituting electrode taking-out portions 40. These exposed portions of the auxiliary electrode portion 42 are electrically connected to an external power supply terminal or the like. It is noted that a formation procedure of each electrode taking-out portion 40 will be described later.

As the cathode layer 21, a sheet member composed of a metal such as aluminum, copper, stainless, nickel, tin, lead, gold, silver, iron, or titanium, an alloy, or the like is used. The sheet member preferably has flexibility to such an extent that the member can be wound in a roll shape. In order to suppress short-circuiting of the element, the surface of the sheet member needs to have smoothness, and its surface roughness is preferably not greater than 100 nm in Ra and further preferably not greater than 10 nm in Ra.

In addition, the first substrate 2 is preferably composed of a metal material having barrier properties to moisture, gas, and the like. By so doing, deterioration of the organic layer 3 by moisture, gas, and the like can be suppressed. Moreover, since the first substrate 2 serves as a cathode for supplying electrons to the organic layer 3, the first substrate 2 is preferably composed of an electrode material such as a metal, an alloy, or an electrically-conductive compound having a low work function, or a mixture thereof.

In addition, for the first substrate 2, a metal such as aluminum or silver or a compound containing these metals can be used, or one formed to have a lamination structure or the like by combining aluminum and another electrode material may be used. Examples of such a combination of electrode materials include a laminate of an alkali metal and aluminum, a laminate of an alkali metal and silver, a laminate of aluminum and a halide of an alkali metal, a laminate of aluminum and an oxide of an alkali metal, a laminate of aluminum and an alkaline earth metal or a rare earth metal, and alloys of these metal species and other metals. Specific examples thereof include a laminate of aluminum and sodium, a sodium-potassium alloy, lithium, magnesium, or the like, a magnesium-silver mixture, a magnesium-indium mixture, an aluminum-lithium alloy, lithium fluoride (LiF)/an aluminum mixture/laminate, and aluminum/an aluminum oxide ($Al_2O_3$) mixture.

For the electron injection layer 31 constituting the organic layer 3, the same material as the material constituting the first substrate 2, metal oxides such as titanium oxide and zinc oxide, and organic semiconductor materials mixed with a dopant which prompts electron injection, including the above materials, are used. In addition, for the light emitting layer 32, any material known as a light emitting material of an organic EL element is used. Examples of such a light emitting material include anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complex, tris(8-hydroxyquinolinate) aluminum complex, tris(4-methyl-8-quinolinate)aluminum complex, tris(5-phenyl-8-quinolinate)aluminum complex, aminoquinoline metal complex, benzoquinoline metal complex, tri-(p-terphenyl-4-yl)amine, pyrane, quinacridone, rubrene, derivatives thereof, a 1-aryl-2,5-di(2-thienyl)pyrrole derivative, a distyrylbenzene derivative, a styrylarylene derivative, a styrylamine derivative, and compounds or polymers having groups composed of these light emitting compounds in part of the molecules. Furthermore, in addition to the compounds derived from fluorescent dyes typified by the above compounds, so-called phosphorescence emitting materials, e.g., light emitting materials such as an Ir complex, an Os complex, a Pt complex, and a europium complex, or compounds or polymers having these materials within the molecules can also be suitably used. Moreover, the light emitting layer 32 composed of these materials may be formed by a dry process such as deposition or transfer, or may be formed by application such as spin coating, spray coating, die coating, or gravure printing.

The material of the hole transport layer 33 can be selected from, for example, the group of compounds having hole transport capability. Examples of such a type of compounds can include triarylamine compounds typified by 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, tris(N-(3-methylphenyl)N-phenylamino)triphenylamine (MTDATA), 4,4'-N,N'-dicarbazolebiphenyl (CBP), spiro-NPD, spiro-TPD, spiro-TAD, and TNB, amine compounds containing a carbazole group, and amine compounds containing a fluorene derivative. However, any generally-known hole transport material can be used. Examples of the material of the hole injection layer 34 include low-molecular-weight organic compounds such as copper phthalocyanine (CuPc), and organic materials including thiophene triphenyl methane, hydrazoline, arylamine, hydrazine, stilbene, and triphenylamine. Specific examples thereof include aromatic amine derivatives such as polyvinyl carbazole (PVCz), polyethylenedioxythiophene:polystyrenesulfonate (PEDOT:PSS), and TPD, and the above materials may be used solely or two or more of them may be used in combination.

For the main electrode portion 41 of the electrode layer 4, any material known as an anode material of an organic EL element can be used. Examples of the anode material include nanowires of metals such as silver, indium tin oxide (ITO), indium zinc oxide (IZO), tin oxide, and gold, nanoparticles including nanodots, electrically-conductive polymers, electrically-conductive organic materials, dopant- (donor- or acceptor-) containing organic layers, and mixtures of a conductor and an electrically-conductive organic material (including a polymer), but the anode material only has to have electrical conductivity and translucency and is not limited to them. Furthermore, in addition to the electrically-conductive material, a binder may be included. Examples of the binder include acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, diacrylphthalate resin, cellulose resin, polyvinyl chloride, polyvinylidene chloride, polyvinyl acetate, other thermoplastic resin, and copolymers of two or more of the monomers constituting these resins.

Figure 5:
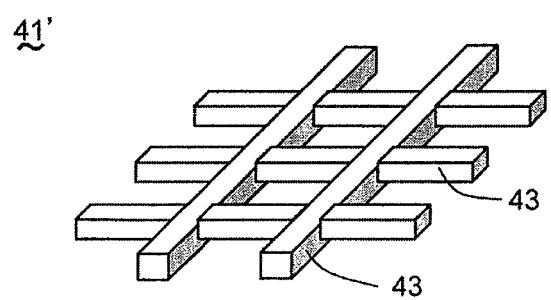
FIG. 5 is a perspective view showing a configuration example of a grid electrode used as an electrode layer of the organic EL device.

In addition, the main electrode portion 41 may be composed of a so-called grid electrode 41' in which low-resistance thin wires 43 are arranged in a lattice manner as shown in FIG. 5, in a stripe manner, or in a honeycomb manner. The diameter of each thin wire 43 is preferably not greater than 100 μm, in order that it is unlikely to reduce the translucency of the main electrode portion 41. Moreover, when the thin wires 43 are arranged in a lattice manner as shown, the interval between each thin wire 43 is set so as to be as large as possible as long as the electrical conductivity can be maintained, and is preferably set such that the aperture ratio is not less than 90%. Examples of the material of the thin wires 43 include various metals such as silver, aluminum, copper, nickel, tin, lead, gold, and titanium, alloys thereof, and electrically-conductive materials such as carbon. The grid electrode 41' is formed by patterning on the organic layer 3 by screen printing, gravure coating, die coating, or the like with a paste containing the above metal or electrically-conductive material. For the grid electrode 41", film formation by application is easily performed and is effective for efficiently manufacturing the organic EL device 1. It is noted that these materials and the forming methods are not particularly limited as long as wettability to the organic layer 3 and damage to the organic layer 3 are not caused.

The auxiliary electrode portion 42 is arranged in a frame shape so as to surround the periphery of the organic layer 3 that faces the auxiliary electrode portion 42, the portions thereof are provided so as to extend from certain regions of the organic layer 3 to the outer peripheral side as described above, and these extended portions constitute the electrode taking-out portions 40. The auxiliary electrode portion 42 is formed by patterning on the second substrate 6 so as to have the above-described shape, and the insulating layer 7 is arranged on a frame-shaped portion of the auxiliary electrode portion 42. In other words, when a high-transparent material is used for the main electrode portion 41 facing the light emitting layer 32 and a high-electrical-conductivity material is used for the surrounding auxiliary electrode portion 42, the translucency of the entire electrode layer 4 is increased and the electrical conductivity thereof also can be increased. As the material of the auxiliary electrode portion 42, various metals used for general wires and electrodes are used, and the material of the auxiliary electrode portion 42 is not particularly limited as long as it has favorable electrical conductivity to the main electrode portion 41. In addition, unlike the main electrode portion 41, the material of the auxiliary electrode portion 42 may not have translucency.

The adhesive layer 5 is a paste-like or sheet-like member which is composed of a resin material having excellent adhesiveness to the first substrate 2 and the insulating layer 7 and is arranged so as to cover the peripheries of the organic layer 3 and the electrode layer 4. Examples of the material of the adhesive layer 5 include silicone resin, fluorine resin, acrylic resin, polyethylene, polypropylene, polyethylene terephthalate, polymethyl methacrylate, polystyrene, and polyvinyl acetate.

The second substrate 6 is a transparent plate-like member formed in the same shape as that of the first substrate 2, and a member having a uniform thickness and surface smoothness is used. As the material of the second substrate 6, for example, translucent glass such as soda lime glass or alkali-free glass, a translucent resin material, or the like is used.

The insulating layer 7 is formed by patterning in a shape substantially similar to that of the frame-shaped portion of the auxiliary electrode portion 42, so as to be wider than the auxiliary electrode portion 42. The insulating layer 7 is not patterned such that the inner periphery thereof is larger in size than the outer periphery of the organic layer 3, and ensures insulation between the auxiliary electrode portion 42 and the organic layer 3. The insulating layer 7 is formed by a wet process using, as the material of the insulating layer 7, a thermosetting resin such as thermosetting polyimide resin or epoxy resin or a thermoplastic resin such as polyethylene or polypropylene, or by a dry process such as sputtering using, as the material of the insulating layer 7, an oxide or a nitride such as silicon oxide or silicon nitride. It is noted that in either process, patterning is required, and in particular, as the wet process, a method such as screen printing, die coating, spray coating, or gravure coating can be preferably used to form the insulating layer 7. It is noted that the adhesive layer 5 can substitute for the insulating layer 7 depending on the type, shape, or the like thereof, and in this case, the insulating layer 7 may not be provided.

The moisture absorbent layer 8 is formed by patterning from a resin material containing a drying agent in such a frame shape that the region where the organic layer 3 is formed is opened. When the moisture absorbent layer 8 is provided, a slight amount of moisture entering the adhesive layer 5 is blocked. Thus, deterioration of the organic layer 3 can be effectively suppressed. As the material of the moisture absorbent layer 8, for example, a material, in which a drying agent such as calcium oxide, barium oxide, sodium oxide, potassium oxide, sodium sulfate, calcium sulfate, magnesium sulfate, calcium chloride, magnesium chloride, copper chloride, or magnesium oxide is added to a photo-curable adhesive resin such as epoxy resin, acrylic resin, or silicone resin can be used. It is noted that the moisture absorbent layer 8 is preferably previously provided on the surface of the second substrate 6 (including the auxiliary electrode portion 42) which surface faces the first substrate 2 before the second substrate 6 and the first substrate 2 are joined.

Figure 6:
FIGS. 6(a) to 6(e) are side cross-sectional views showing a production procedure of the electrode taking-out portion of the organic EL device.
Figure 6:
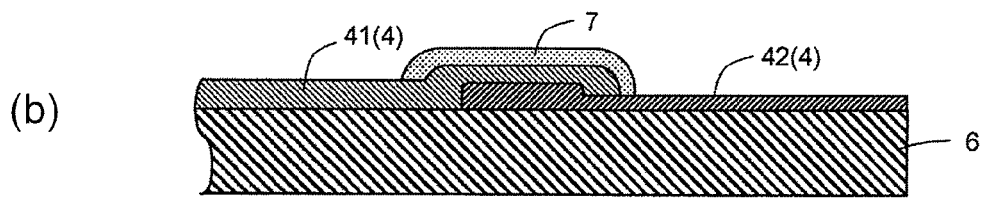
Figure 6:
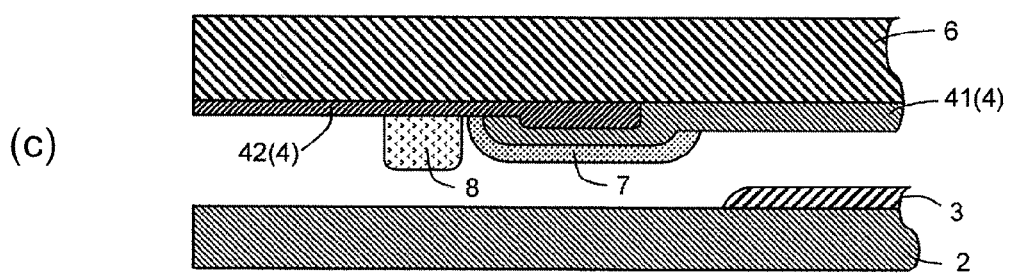
Figure 6:
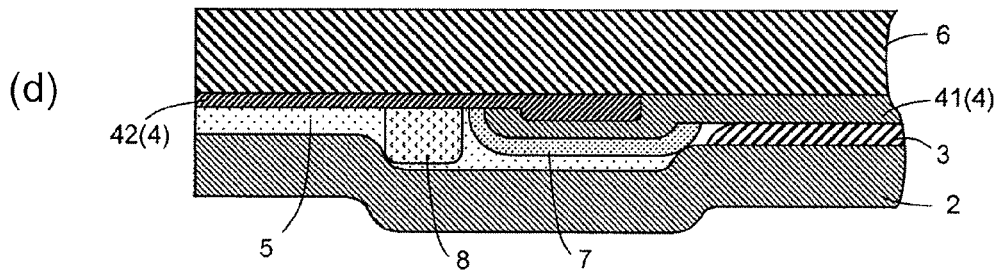
Figure 6:
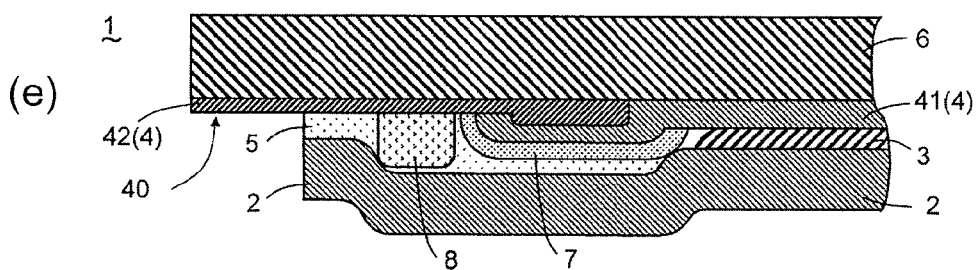

Next, the formation procedure of the electrode taking-out portion 40 will be described with reference to FIGS. 6(a) to 6(e). As shown in FIG. 6(a), the organic layer 3 is laminated on the first substrate 2. In addition, as shown in FIG. 6(b), the auxiliary electrode portion 42, the main electrode portion 41, and the insulating layer 7 are formed by patterning in predetermined shapes, respectively, on the second substrate 6. Moreover, as shown in FIG. 6(c), the first substrate 2 and the second substrate 6 are arranged such that the organic layer 3 and the electrode layer 4 (the main electrode portion 41) are in contact with each other, the moisture absorbent layer 8 is provided at a predetermined position on the second substrate 6, and these components are adhesively fixed to each other by the adhesive layer 5 as shown in FIG. 6(d). At that time, the adhesive layer 5 is arranged so as to not cover the extended auxiliary electrode portion 42. In addition, the auxiliary electrode portion 42 and the insulating layer 7 are formed in a frame shape (see FIG. 1) and are laminated such that the laminated portion is thicker than the other portion, whereby the auxiliary electrode portion 42 and the insulating layer 7 serve as a dam that blocks the adhesive layer 5 from flowing in to the organic layer 3 side. After joining, the first substrate 2 that faces the extended auxiliary electrode portion 42 is removed such that the auxiliary electrode portion 42 is exposed, whereby the electrode taking-out portion 40 is formed. It is noted that after the first substrate 2 that faces the extended auxiliary electrode portion 42 is removed, the first substrate 2 and the second substrate 6 may be joined to each other.

In other words, since the electrode layer 4 provided so as to extend in the region where the organic layer 3 is not formed is exposed from the first substrate 2 to form the electrode taking-out portion 40, the electrode taking-out portion 40 can be formed by a simple procedure in which, for example, the first substrate 2 is removed, and the organic EL device 1 can be efficiently manufactured. In addition, materials having flexibility can be used as the materials constituting the first substrate 2, the organic layer 3, the insulating layer 7, the auxiliary electrode portion 42, and the main electrode portion 41, and the second substrate 6 may be flexible or hard. In other words, when the first substrate 6 (SIC: correctly it should be first substrate 2) produced so as to have flexibility and having the organic layer 3 thereon is joined to the flexible or hard second substrate 6 as appropriate, both flexible type and hard type organic EL devices 1 can be manufactured by using the first substrate 6 (SIC: correctly it should be first substrate 2) of the same configuration having the organic layer 3 thereon.

In addition, in the organic EL device 1 according to the present embodiment, a band-like sheet member fed in a state of being wound in a roll shape can also be used as the first substrate 2. In this case, the organic layer 3 is continuously formed on a surface of the band-like first substrate 2 by a slit coater or the like. After the formation, the first substrate 2 is wound in a roll shape again and collected. By so doing, a sheet roll (not shown) composed of a first substrate 6 (SIC: correctly it should be first substrate 2) having a plurality of organic layers 3 thereon can be produced by a so-called roll-to-roll process. Then, the sheet roll is adhered to the long second substrate 6 which is formed with the same width and the same length as the band-like first substrate 2 and on which the electrode layer 4 and the like are formed, they are cut at regular intervals, and the first substrate 2 is removed as described above, whereby the electrode taking-out portion 40 is formed. By so doing, many organic EL devices 1 as shown in FIG. 2 can be manufactured in a short time. In particular, in recent years, the organic layer 3 tends to be multilayered, for example, the light emitting layer 32 are formed as multiple layers, and electric charge adjusting layers are arranged therebetween. The formation of the organic layer 3 by the roll-to-roll process allows many organic layers composed of multiple layers as described above to be simultaneously produced.

It is noted that the present invention is not limited to the embodiments described above, and various modifications can be made as long as: the region where the organic layer is not formed is present in the peripheral portion of the substrate; and the electrode layer is exposed by removing the portion of the substrate that faces the electrode layer arranged in this region, thereby forming an electrode taking-out portion.

The present application is based on Japanese Patent Application No. 2011-035172, and the content thereof is incorporated herein by reference to the specification and the drawings of the above patent application.

DESCRIPTION OF THE REFERENCE CHARACTERS 1 organic EL device
2 first substrate (cathode)
3 organic layer
4 electrode layer (anode)
40 electrode taking-out portion
41 main electrode portion
42 auxiliary electrode portion
5 adhesive layer
6 second substrate
7 insulating layer
8 moisture absorbent layer

What is claimed is:

1. An organic EL device comprising:
a first substrate having electrical conductivity;
an organic light emitting layer provided on the first substrate;
a second substrate having translucency; and
an electrode layer provided on the second substrate, wherein
a first surface of the first substrate, on which the organic light emitting layer is provided, and a surface of the second substrate, on which the electrode layer is provided, are located so as to face each other, and the organic light emitting layer is not present in a region of a peripheral portion of the first substrate,
on the second substrate, a portion of the electrode layer is provided in a portion facing the region of the peripheral portion of the first substrate where the organic light emitting layer is not present, so as to define an extended portion that extends to an outer peripheral side of a region where the organic light emitting layer is present,
the first substrate is not present in a portion facing the extended portion of the electrode layer, and at least a part of the extended portion of the electrode layer is exposed from the first substrate, thereby constituting an electrode taking-out portion,
one surface of the extended portion of the electrode layer that is exposed from the first substrate physically contacts the second substrate, the one surface being opposite a surface of the electrode layer, that faces the first substrate,
the first substrate, on which the organic light emitting layer is provided, and the second substrate, on which the electrode layer is provided, are joined to each other by an adhesive layer provided on a peripheral portion of one of the first substrate and the second substrate,
the first substrate defining an electrode other than the electrode layer,
at least a portion of a second surface of the first substrate is exposed to an exterior of the organic EL device, the second surface of the first substrate being opposite the first surface of the first substrate,
the electrode layer extends continuously along an extending direction of the first substrate from a first outer edge of the first substrate to a second outer edge of the first substrate, the first outer edge of the first substrate and the second outer edge of the first substrate each overlap with the electrode layer in a cross-sectional direction of the organic EL device.

2. The organic EL device according to claim 1, wherein the adhesive layer comprises a moisture absorbent layer.

3. The organic EL device according to claim 2, wherein the electrode layer comprises a main electrode portion which is in contact with the organic light emitting layer, and an auxiliary electrode portion which is in contact with the main electrode portion and is insulated from the organic light emitting layer.

4. The organic EL device according to claim 2, wherein the first substrate is composed of a metal material having barrier properties.

5. The organic EL device according to claim 1, wherein the electrode layer comprises a main electrode portion which is in contact with the organic light emitting layer, and an auxiliary electrode portion which is in contact with the main electrode portion and is insulated from the organic light emitting layer.

6. The organic EL device according to claim 5, wherein the electrode layer in the electrode taking-out portion is a portion of the auxiliary electrode portion.

7. The organic EL device according to claim 6, wherein the first substrate is composed of a metal material having barrier properties.

8. The organic EL device according to claim 5, wherein the first substrate is composed of a metal material having barrier properties.

9. The organic EL device according to claim 1, wherein the first substrate is composed of a metal material having barrier properties.

10. The organic EL device according to claim 1, wherein the first substrate is a cathode for supplying electrons to the organic light emitting layer.

11. The organic EL device according to claim 1, wherein the organic light emitting layer includes a light emitting layer.

12. The organic EL device according to claim 1, the adhesive layer contacting at least the first substrate and at least the electrode layer on the second substrate.

13. The organic EL device according to claim 1, wherein the extended portion extends to an outer edge of the second substrate.

14. An organic EL device comprising:
a first substrate having electrical conductivity, the first substrate bounded by an outer periphery;
an organic light emitting layer provided on the first substrate, the organic light emitting layer bounded by an outer periphery;
a second substrate having translucency, the second substrate bounded by an outer periphery; and
an electrode layer provided on the second substrate, the electrode layer including:
a main electrode portion bounded by an outer periphery; and
an auxiliary electrode portion that surrounds and extends beyond the outer periphery of the main electrode portion, the auxiliary electrode portion including:
a body portion bounded by an outer periphery; and
extended portions extending outwardly from opposing sides of the outer periphery of the body portion of the auxiliary electrode portion, the extended portions having free ends located at positions farthest away from the outer periphery of the body portion of the auxiliary electrode portion in the respective extending directions, wherein
a first surface of the first substrate, on which the organic light emitting layer is provided, and a surface of the second substrate, on which the electrode layer is provided, are located so as to face each other,
the outer periphery of the first substrate extends beyond the outer periphery of the organic light emitting layer, the outer periphery of the first substrate extending at least as far as the free ends of the extended portions except for portions of the first substrate that face the extended portions, at the portions of the first substrate that face the extended portions, the free ends of the extended portions extend beyond the outer periphery of the first substrate such that the surfaces of the extended portions are exposed from the first substrate and comprise an electrode taking-out portion, one surface of each of the extended portions of the electrode layer that are exposed from the first substrate physically contact the second substrate, the one surface being opposite a surface of the electrode layer that faces the first substrate, the first substrate, on which the organic light emitting layer is provided, and the second substrate, on which the electrode layer is provided, are joined to each other by an adhesive layer provided on a peripheral portion of one of the first substrate and the second substrate, the first substrate defining an electrode other than the electrode layer, and at least a portion of a second surface of the first substrate is exposed to an exterior of the organic EL device, the second surface of the first substrate being opposite the first surface of the first substrate.

\* \* \* \* \*